United States Patent
Yang

(10) Patent No.: US 7,447,263 B2
(45) Date of Patent: *Nov. 4, 2008

(54) PROCESSING DIGITAL DATA PRIOR TO COMPRESSION

(75) Inventor: Rongzhen Yang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/361,270

(22) Filed: Feb. 23, 2006

(65) Prior Publication Data

US 2006/0193378 A1 Aug. 31, 2006

Related U.S. Application Data

(63) Continuation of application No. 10/106,934, filed on Mar. 25, 2002, now Pat. No. 7,039,106.

(51) Int. Cl.
*H04B 1/66* (2006.01)
*H04L 25/06* (2006.01)

(52) U.S. Cl. .................. 375/240; 370/521; 341/55; 708/203

(58) Field of Classification Search .......... 375/240, 375/369, 264, 286, 253; 708/203; 341/316, 341/340, 55–57, 59, 95, 200; 380/269, 42, 380/287; 370/521
See application file for complete search history.

(56) References Cited

U.S. PATENT DOCUMENTS

| | | | |
|---|---|---|---|
| 4,558,302 A | * | 12/1985 | Welch .................. 341/51 |
| 5,287,193 A | | 2/1994 | Lin |
| 5,652,581 A | | 7/1997 | Furlan et al. |
| 5,870,036 A | * | 2/1999 | Franaszek et al. .......... 341/51 |
| 6,112,208 A | * | 8/2000 | Ikegami .................. 707/101 |
| 6,732,204 B2 | | 5/2004 | Ishida |
| 7,039,106 B2 | | 5/2006 | Yang |
| 2003/0137437 A1 | | 7/2003 | Watson |
| 2003/0179823 A1 | | 9/2003 | Yang |
| 2005/0091049 A1 | | 4/2005 | Yang et al. |

FOREIGN PATENT DOCUMENTS

| | | |
|---|---|---|
| CN | 1257621 | 6/2000 |
| EP | 0 909 037 | 4/1999 |
| WO | WO98/48516 | 10/1998 |
| WO | WO02/19708 | 3/2002 |

OTHER PUBLICATIONS

Shannon, C.E., "A Mathematical Theory of Communication", *Bell System Technical Journal*, 27(3):379-423 & 623-656, Jul. and Oct. 1948.
Held, G., "Data Compression; Techniques and Applications; Hardware and Software Considerations", Chichester, J. Wiley and Sons, pp. 18-20 & 26-40, 1983.
Rissanen, J., "a Universal Data Compression System", *IEEE Transactions on Information Theory*, IT-29(5):656-664, Sep. 1983.

* cited by examiner

*Primary Examiner*—Jean B Corrielus
(74) *Attorney, Agent, or Firm*—Fish & Richardson P.C.

(57) ABSTRACT

A method includes receiving an original string of bits where each of the bits represents one of two possible logic levels. The string of bits also carries information. A new string is formed, based on the original string, which contains all of the information of the original string by using fewer bits of one of the logic levels.

11 Claims, 5 Drawing Sheets

PROCESSING DIGITAL DATA PRIOR TO COMPRESSION

CROSS-REFERENCE TO RELATED APPLICATIONS

This application is a continuation of and claims the benefit of U.S. application Ser. No. 10/106,934, filed Mar. 25, 2002, now U.S. Pat. No. 7,039,106, and is incorporated herein by reference.

TECHNICAL FIELD

This application relates to processing digital data prior to compression.

BACKGROUND

Compression is useful, for example, to reduce the volume of bits transferred on a communication line from one computer to another, and in that way to reduce the time required for the transfer. The statistical nature of a string of digital data imposes a fundamental limit, known as the entropy rate, on the degree of compression that can be achieved.

DESCRIPTION

As shown in FIG. 1(a), in some implementations, the entropy rate for compressing a string of bits 20 can be approached by preprocessing the string, prior to compression, into two bit strings A and B 30, 40 that include fewer logic level 0 bits than does the original string. In reducing the number of logic level 0 bits, the probability that a particular bit has a logic level 1 bit can be made greater than the probability of a logic level 0 bit. By increasing this probability difference, the subsequent compression of bit string A 30 and bit string B 40 can produce a compressed string that approaches the entropy rate.

Figure 2:
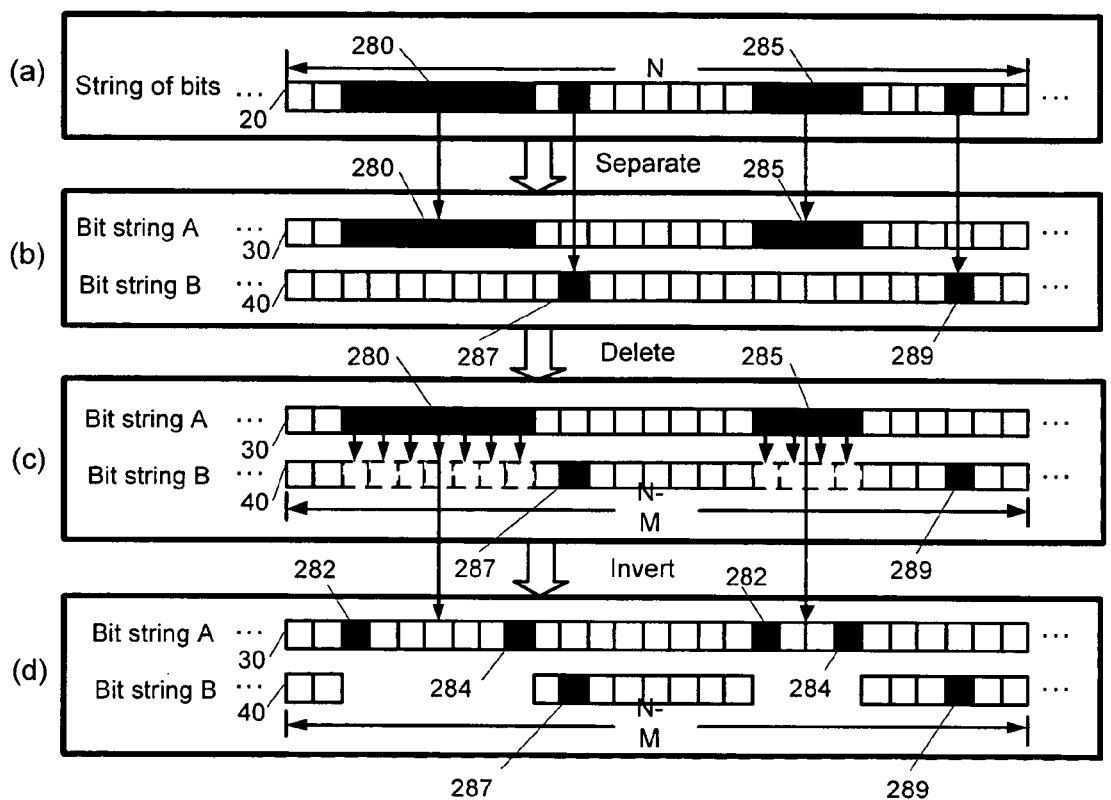
FIG. 2 shows processing a string of bits prior to compression.

Referring to FIG. 2, the original string of bits 20 may contain any number (N) of bits, for example, as shown in FIG. 2(a). Each bit is represented by a square that is either black, for a logic level 0 bit, or white, for a logic level 1 bit. As shown in FIG. 2(b), bit string A 30 and bit string B 40 are two sub-strings formed from the string of bits 20. Bit string A 30 includes all blocks of consecutively positioned logic 0 bits from the original string of bits 20 and they occupy the same positions in bit string A as in the original bit string. Bit string B 40 contains all non-consecutively positioned bits of logic level 0, also in their original positions. Bit string A 30 includes, in this example, a block of 7 consecutive logic 0 bits 280 from the original string of bits 20 and a block of 4 consecutive logic 0 bits 285 also from the original string of bits 20. All other bits in bit string A are given logic level 1. Bit string B 40 also has a length of N bits and includes, in this example, the two logic 0 bits 287, 289 that were included in the original string of bits and were not positioned within a block of consecutive logic 0 bits. All other bits in string B are given logic level 1.

Figure 3:
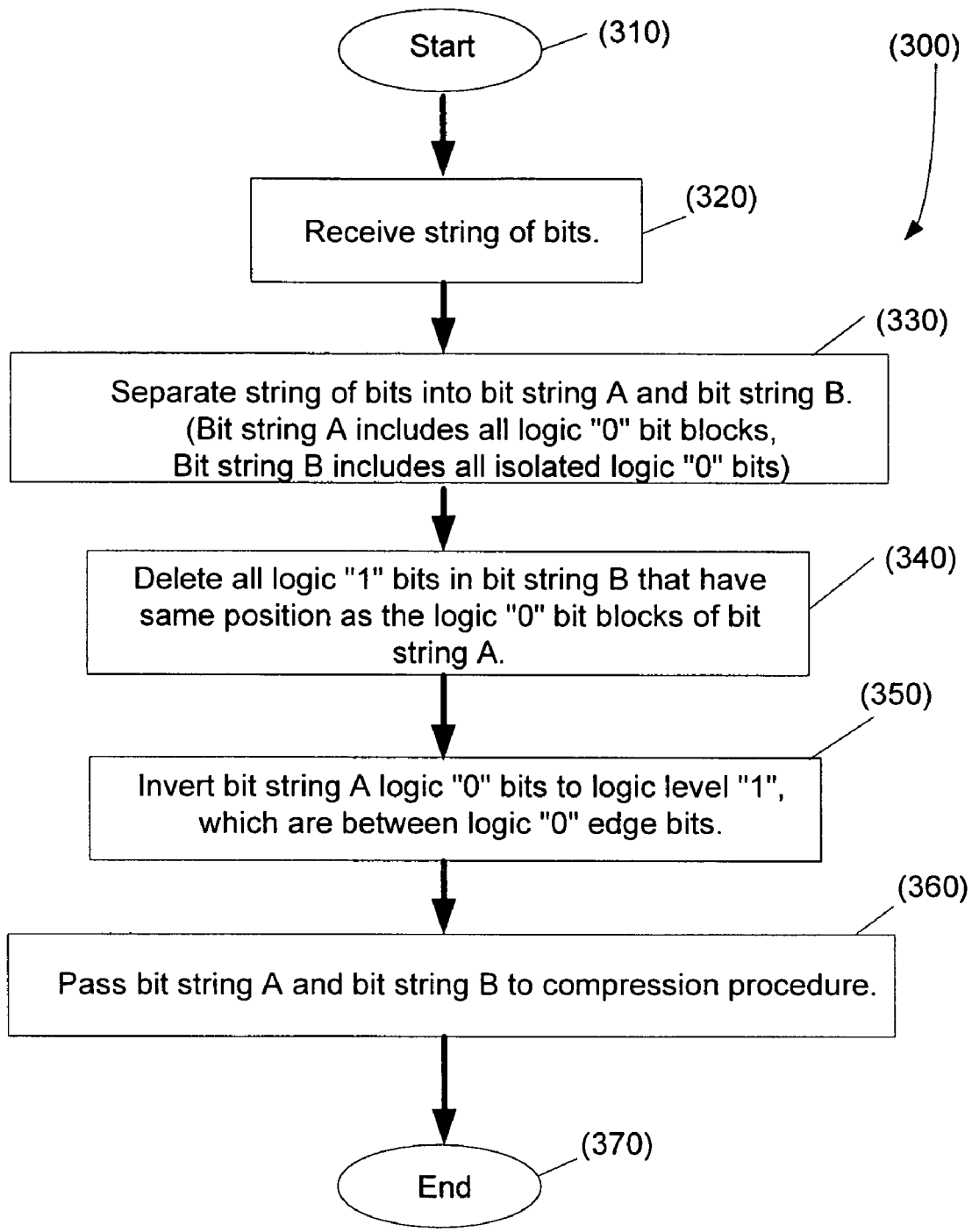
FIG. 3 shows a flow diagram of a pre-compression procedure.

The process for generating strings A and B is illustrated in FIG. 3, beginning with a processing procedure (300) that starts (310) prior to compression. An original string of bits is received (320) by a computer for processing into the two bit strings A and B having a reduced number of logic level 0 bits. The original string of bits is separated (330) into bit string A and bit string B.

Next, as illustrated in FIG. 2(c) those logic 1 bits in bit string B 40 that have the same position as the blocks of consecutive logic 0 bits in bit string A 30, are deleted from string B. By deleting these bits in bit string B, bit string B is shortened to a length of N−M bits, where M is the number of logic 0 bits contained in string A. In the example of FIG. 2(c), bit string B is shortened by M=11 bits.

As shown in FIG. 3, after deleting (340) the bits in bit string B, all of the logic 0 bits in bit string A are inverted (350) to logic level 1, except for the logic 0 bits 282, 284 which define the edges of the blocks of logic 0 bits, which remain at a logic level 0. Thus, as shown in FIG. 2(d), the only logic 0 bits in bit string A 30 are the bits that define the starting 282 and ending 284 bits of the blocks 280, 285 of logic 0 bits.

By reducing the number of logic 0 bits in bit string A 30 and bit string B 40, the probability that a logic level 0 occurs at any particular bit is smaller than the probability of a logic level 1 occurring at that particular bit. By increasing the difference of the probability of a logic level 1 and a logic level 0, the number of bits required to compress bit string A and bit string B is closer to the theoretic compression length, the entropy rate. By approaching the entropy rate, the fewer bits required for compression correspond to faster transfer periods of the compressed bit strings.

Returning to FIG. 3, after the logic 0 bits of bit string A have been inverted (350), except for the block start and end bits, the procedure (300) passes (360) bit string A 30 and bit string B to any typical procedure for compressing the two bit strings prior to ending (370). For example, bit string A 30 and bit string B 40 may be concatenated into a single bit string, of length N+N', where N'=N−M, and compressed, for example, by a Huffman compression technique. Because the bits in the two strings are mostly logic level 1, the compression can get much closer to the entropy rate than would typically be true for compression of the original string.

Figure 4:
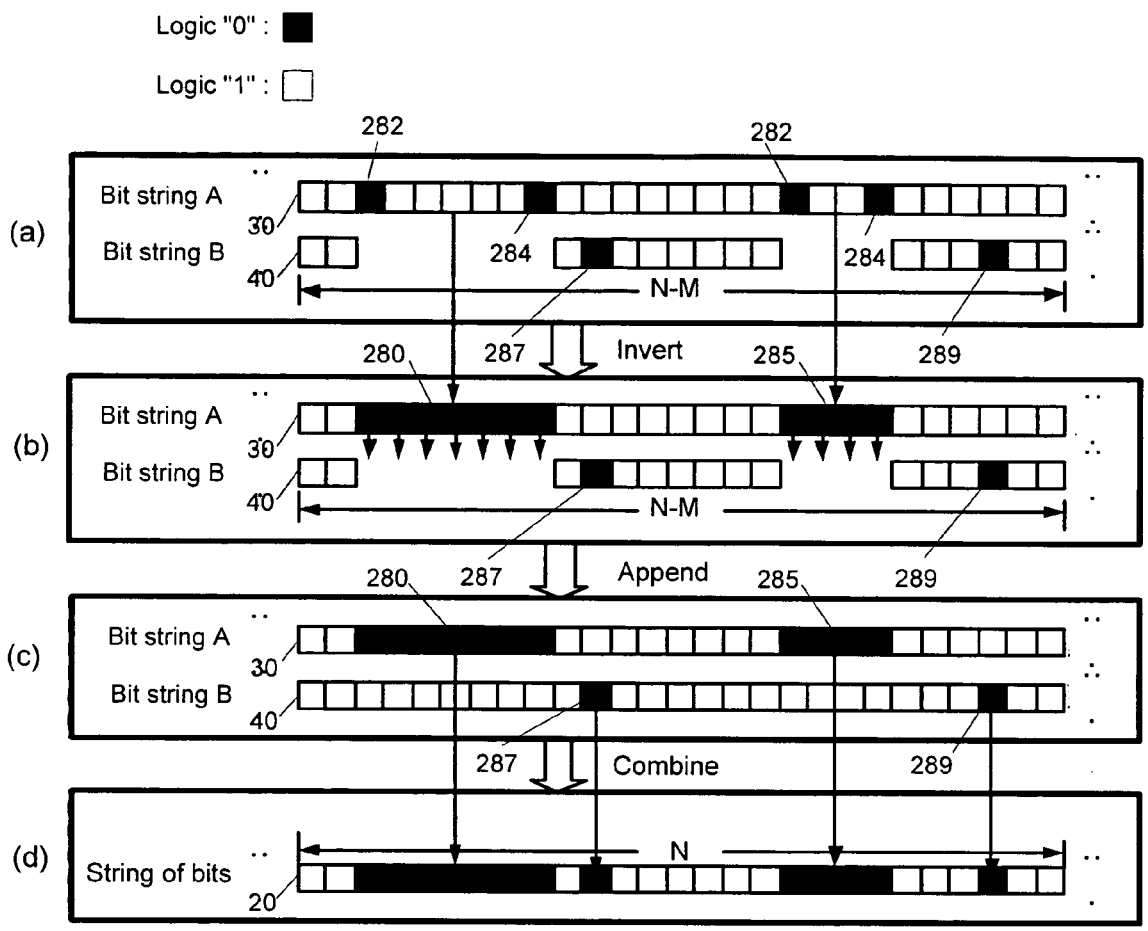
FIG. 4 shows processing a string of bits after decompression.

Referring to FIG. 4, the original string of bits 20 may be restored by reversing the process illustrated in FIG. 2. After decompressing and de-concatenating the two sub-strings, bit string A 30 and bit string B 40, as shown in FIG. 4(a), are identical in length and make-up to the bit strings shown in FIG. 2(d). Similar to FIG. 2, black squares still represent logic 0 bits and white squares represent logic 1 bits. As shown in FIG. 4(b), the logic 1 bits between the starting 282 and ending 284 bits are inverted from logic level 1 to logic level 0 and form the blocks of 7 consecutively positioned logic 0 bits 280 and four consecutively positioned logic 0 bits 285.

Figure 5:
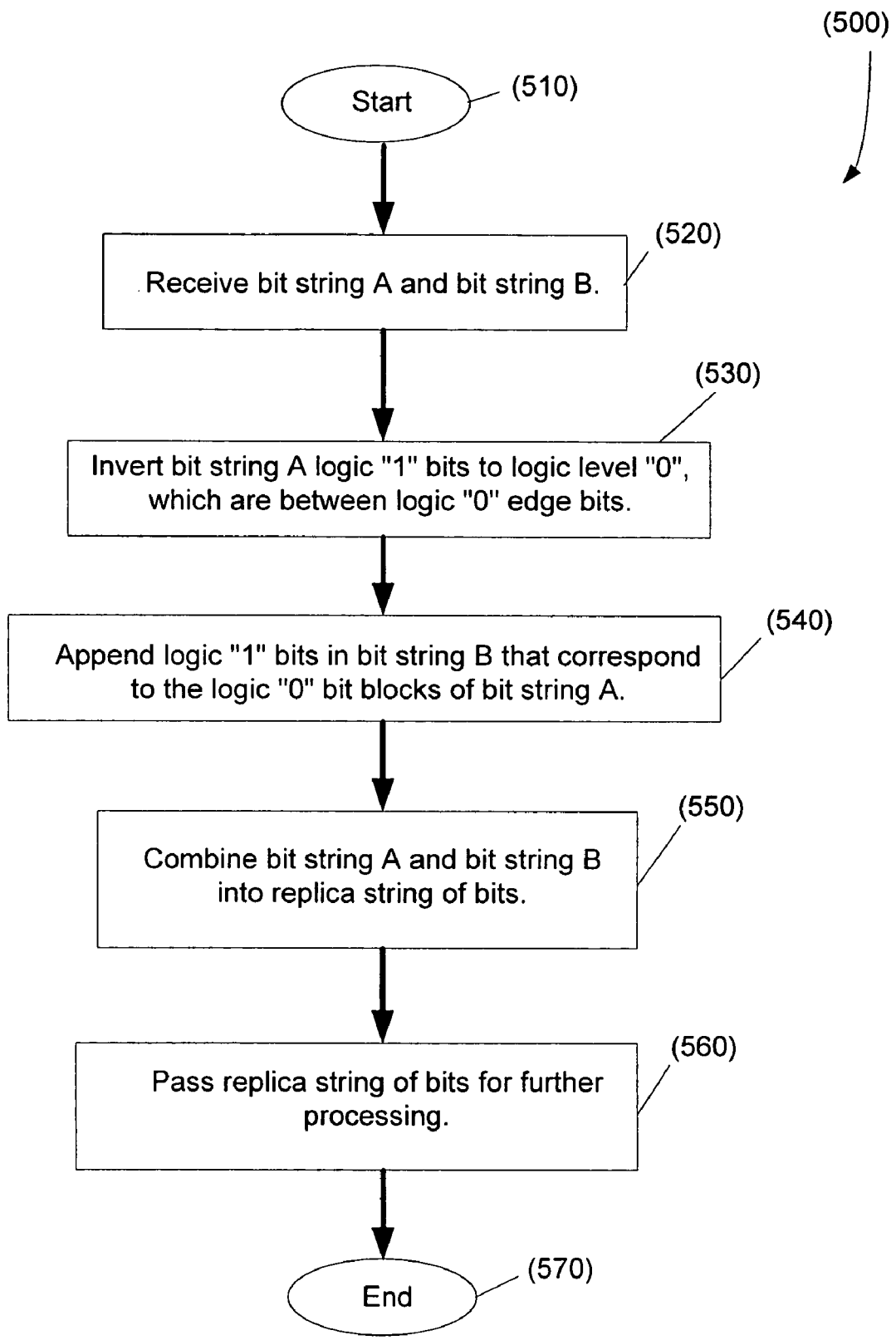
FIG. 5 shows a flow diagram of a post-decompression procedure.

The process for restoring the original string of bits 20 is illustrated in FIG. 5, beginning with a processing procedure (500) that starts (510) after the bit string A 30 and bit string B 40 have been decompressed and deconcatenated. Bit string A and bit string B are received (520), for example, by a computer for processing into the original string of bits 20. The logic 1 bits between the starting and ending bits are inverted (530) returning the blocks of consecutively positioned blocks of logic 0 bits to bit string A.

Next, as illustrated in FIG. 4(c) logic 1 bits are appended to bit string B 40 in positions corresponding the blocks of logic 0 bits 280, 285 in bit string A 30. In this example bit string B returns to a length of N bits by appending the 11 logic 1 bits that were deleted in FIG. 2(c).

As shown in FIG. 5, after appending (540) the logic 1 bits to bit string B, both bit strings are combined (550) by logically summing each bit pair in the same position of each bit string. Thus, as illustrated in FIG. 4(d), combining bit strings A and B results in an N length string of bits 20 that is a replica of the string of bits 20 shown in FIG. 2(a).

Returning to FIG. 5, after the two bit strings are combined, the replica string of bits is passed (560), for example, to further process the binary information stored in the replica string of bits 20 prior to the procedure ending (570).

Returning to FIG. 1(a), the processing of the original string of bits 20 is done in hardware and software that includes an input port 90, included in computer 10, where the original string of bits 20 is received. The received string is stored a memory 60. The memory 60 also includes software 100 for processing the string of bits 20 into bit string A 30 and bit string B 40. The software 100 may also include instructions to compress the two bit strings 30, 40, into a compressed string of bits 70, which is also stored in the memory 60. After compressing, the compressed string of bits 70 may be transferred from the memory 60 through an output port 110 to other computers or other devices. Computer 10 also includes a processor 50 that executes the software 100 instructions and operating system 120 instructions, also stored in the memory 60.

Referring to FIG. 1(b), the compressed string of bits 70 may be received through an input port 210, included in another computer 200, for decompressing and further processing. By transferring the compressed string of bits 70 from computer 10 to computer 200, the number of bits transferred is reduced along with the transfer period. The compressed string of bits 70 may be stored in a memory 220, included in computer 200, which also stores software 230 to decompress the compressed string of bits 70 and process the recovered bit strings A 30 and B 40 into a replica of the original string of bits 20. A processor 240 may execute the instructions of software 230 for decompressing and processing of the digital data. After decompressing and processing, the string of bits 20 may be transferred from computer 200 via an output port 250 by executing instructions stored in an operating system 260 also stored in the memory 220. The string of bits 20 may also remain in the memory 220 for further processing on computer 200.

Although some implementation examples have been discussed about, other implementations are also within the scope of the following claims.

Figure 1:
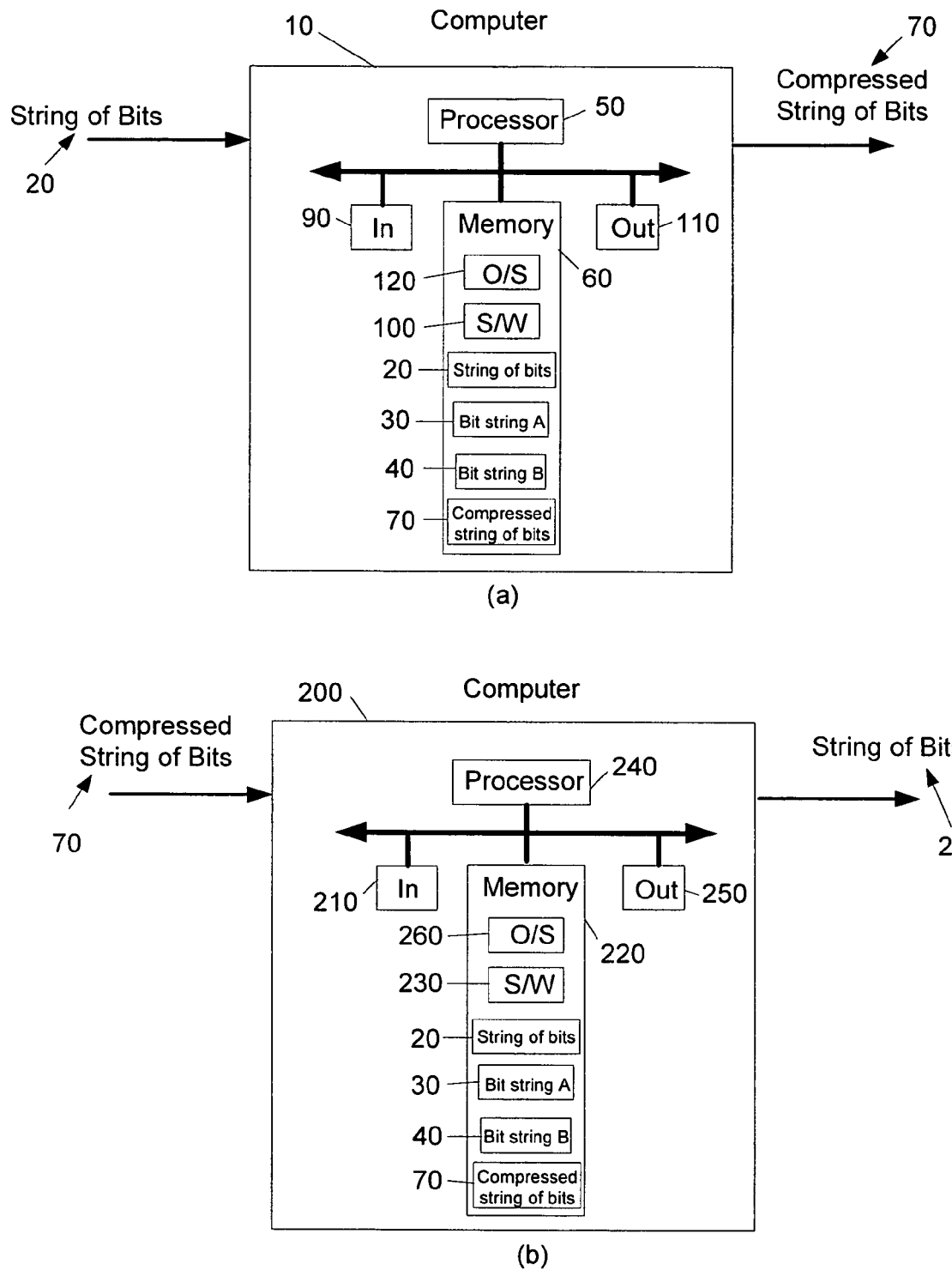
FIG. 1 shows a block diagram of a computer.

For example, in the implementation discussed in conjunction with FIG. 1, computers 10 and 200 process the string of bits 20. However, other types of digital devices, such as cellular telephones, personal digital assistants (PDA), pagers, or other similar digital devices may be used to process the string of bits 20. These digital devices may also be used individually, or in combination, to process the string of bits 20.

Also in conjunction with FIG. 1, various devices may input and output the bit strings A 30 and B 40. Input ports 90 and 210 and output ports 110 and 250 are one example. In other examples, keyboards, diskettes, compact disc read only memories (CD-ROM), or Ethernet connections can input and output the bit strings. Also video displays, printers, or other peripherals may output the bit strings from the computers.

In conjunction with FIGS. 2-5, processing procedures (300) and (500) operated on blocks of logic 0 bits. However, processing procedures (300) and (500) may also be configured to operate on blocks of logic 1 bits. Other discrete logic representations may also be utilized by the processing procedures (300) and (500).

In the examples described above, the original strings of bits 20 and bit strings A 30 and B 40 were processed, compressed, transferred, decompressed, and reprocessed by computer 10 and computer 200. However, other types of digital data may be transferred between the computers. For example, digital data files, streams of digital data, or other similar digital data may transfer between the computers.

The procedure (300), described in conjunction with FIGS. 2 and 3, and procedure (500), described in conjunction with FIGS. 4 and 5, are not limited to any particular hardware or software configuration; they may find applicability in any computing or processing environment. Procedures (300) and (500) may be implemented in hardware, software, or any combination of the two. Procedure (300) and (500) may be implemented in computer programs executing on machines (e.g., programmable computers) that each include a processor, a machine-readable medium readable by the processor (including volatile and non-volatile memory and/or storage elements), at least one input device, and one or more output devices. Procedure (300) and (500) may also be implemented in an application specific integrated circuit (ASIC). Program code may be applied to the string of bits 20, received by the computer 10 and computer 200, in conjunction with FIG. 1, to perform procedure (300), or procedure (500), or to generate output information. The output information may be applied to one or more devices, such as the output ports 110 and 250.

Each computer program may be implemented in a high-level procedural or object-oriented programming language to communicate with a computer system. However, the computer programs can be implemented in assembly or machine language, if desired. In any case, the language may be a compiled or interpreted language.

Each computer program may be stored on a machine-readable medium or device, e.g., random access memory (RAM), read only memory (ROM), compact disc read only memory (CD-ROM), hard disk drive, magnetic diskette, or similar medium or device, that is readable by a machine (e.g., a general or special purpose programmable computer) for configuring and operating the machine when the readable medium or device is read by the machine to perform procedure (300) and procedure (500). Procedure (300) and procedure (500) may also be implemented as a machine-readable storage medium, configured with a computer program, where, upon execution, instructions in the computer program cause the machine to operate in accordance with procedure (300) and procedure (500).

Procedure (300) may operate on one computer while procedure (500) may operate on a separate computer.

What is claimed is:

1. A method of processing digital data comprising:
receiving electronically a first string of bits and a second string of bits, the first and second strings having an identical length and carrying information, each of the bits representing one or the other of two logic levels defined by a first logic level and a second logic level, the received first and second strings of bits carrying fewer bits of one of the logic levels, the received first string including blocks of bits, the blocks being of varying lengths, each block of bits including a start bit and an end bit having the first logic level and one or more bits between the start bit and the end bit having the second logic level;

for each block of bits in the first string, inverting the bits, included between the start bit and the stop bit, having the second logic level to the first logic level;

appending bits of the second logic level to the received second string at positions corresponding to the blocks of bits in the received first string;

forming a new string using a combination of the first string that includes the inverted bits and the second string that includes that appended bits, the new string carrying all of the information and including more bits of one of the logic levels than were included in the received string of bits;

recovering an original string based on the new string; and storing said recovered original string in a portion of a memory device for further processing.

2. The method of claim 1 in which the new string is shorter than the received first and second strings.

3. The method of claim 1 in which the received second string of bits includes one or more isolated bits having the first logic level.

4. A digital device comprising:

a processor configured to execute instructions; and a memory for storing said instructions for causing the processor to, receive a first string of bits and a second string of bits, the first and second strings having an identical length and carrying information, each of the bits representing one or the other of two logic levels defined by a first logic level and a second logic level, the received first and second string of bits carrying fewer bits of one of the logic levels, the received first string of bits including blocks of bits, the blocks being of varying lengths, each block of bits including a start bit and an end bit having the first logic level and one or more bits between the start bit and the end bit having the second logic level, for each block of bits in the first string, invert the bits, included between the start bit and the stop bit, having the second logic level to the first logic level, append bits of the second logic level to the received second string at positions corresponding to the blocks of bits in the received first string, form a new string using the first string that includes the inverted bits and the second string that includes the appended bits, the new string carrying all of the information and including more bits of one of the logic levels than were included in the received string of bits, and recover an original string based on the new string.

5. The digital device of claim 4 in which the new string is shorter than the received first and second strings.

6. The digital device of claim 4 in which the received second string of bits includes one or more isolated bits having the first logic level, the device further comprising instructions for causing the processor to segregate the received first and second strings into a first group and a second group, the first group including the one or more blocks of bits, and the second group including the one or more isolated bits.

7. An article comprising a machine-readable medium that stores machine readable instructions for causing a digital device to:

receive a first string of bits and a second string of bits, the first and second strings having an identical length and carrying information, each of the bits representing one or the other of two logic levels defined by a first logic level and a second logic level, the received first and second strings of bits carrying fewer bits of one of the logic levels, the received first string of bits including blocks of bits, the blocks being of varying lengths, each block of bits including a start bit and an end bit having the first logic level and one or more bits between the start bit and the end bit having the second logic level, for each block of bits, invert the bits, included between the start bit and the stop bit, having the second logic level to the first logic level, appending bits of the second logic level to the received second string at positions corresponding to the blocks of bits in the received first string, form a new string using a combination of the first string that includes the inverted bits and the second string that includes that appended bits, the new string carrying all of the information and including more bits of one of the logic levels than were included in the received string of bits, and recover an original string based on the new string.

8. The machine readable medium of claim 7 wherein the new string is shorter than the received first and second strings.

9. A method of processing digital data comprising:

receiving electronically an original string of bits, each of the bits representing one or the other of two logic levels defined by a first logic level and a second logic level, the original string of bits carrying information;

forming a first bit string and a second bit string based on the received original string, the first bit string comprising blocks of bits having the first logic level and the second bit string comprising isolated bits having the first logic level, the original string, the first bit string, and the second bit string having the same number of bits;

inverting bits positioned between a start bit and a stop bit in each block of bits in the first bit string from the first logic level to the second logic level;

deleting bits of the second level positioned in the second bit string corresponding to the blocks of bits in the first bit string that includes the start bit and the stop bit;

forming a compressed string derived from a new string that is based on the first bit string including the inverted bits and the second bit string after deleting the bits of the second level.

10. The method of claim 9, wherein deleting the bits comprises:

prior to inverting the bits of the first block of bits in the first bit string, deleting at least one bit from the second bit string, each deleted bit corresponding to a bit of the first block of bits of the first bit string.

11. The method of claim 9, further comprising:

decompressing the compressed string into a first decompressed bit string and a second decompressed bit string that share a common length, the first decompressed bit string comprising a first block of bits including a start bit and an end bit having the first logic level and one or more bits between the start bit and the end bit having the second logic level;

inverting the one or more bits between the start bit and the end bit of the first block of bits in the decompressed first bit string from the second logic level to the first logic level, the start bit and the end bit of the first block of bits not being inverted; and appending bits to the decompressed second bit string corresponding to the bits of the first block of bits in the decompressed first bit string; and forming a new bit string by combining the decompressed first bit string that includes the inverted bits and the decompressed second bit string that includes the appended bits.

* * * * *